United States Patent
Molitoris

Patent Number: 5,121,994
Date of Patent: Jun. 16, 1992

[54] THERMOCOUPLE FOR AUTOCLAVE AND METHOD OF MAKING THE SAME

[75] Inventor: Theodore M. Molitoris, Saddle Brook, N.J.

[73] Assignee: Thermo Electric Co., Saddle Brook, N.J.

[21] Appl. No.: 671,508

[22] Filed: Mar. 19, 1991

[51] Int. Cl.⁵ .................. G01K 7/02; H01L 35/02; H01L 35/34

[52] U.S. Cl. .................. 374/179; 136/232; 136/233

[58] Field of Search ............. 374/179; 136/230, 232, 136/233, 234, 242

[56] References Cited

U.S. PATENT DOCUMENTS

| | | | |
|---|---|---|---|
| 1,660,504 | 2/1928 | Grubb | 374/179 |
| 2,676,195 | 4/1954 | Hart | 136/232 |
| 2,915,575 | 12/1959 | Thomas | 136/232 |
| 3,284,247 | 11/1966 | McCall | 136/233 |
| 3,305,405 | 2/1967 | Jamieson | 136/233 |
| 4,369,795 | 1/1983 | Bicher et al. | 374/179 |
| 4,454,370 | 6/1984 | Voznick | 374/179 |
| 4,638,107 | 1/1987 | Davis | 136/233 |
| 4,647,710 | 3/1987 | Davis | 136/233 |
| 4,752,770 | 6/1988 | St. Pierre | 374/179 |

FOREIGN PATENT DOCUMENTS

| | | | |
|---|---|---|---|
| 0158388 | 11/1955 | Canada | 136/234 |
| 1027909 | 4/1958 | Fed. Rep. of Germany | 136/233 |

Primary Examiner—William A. Cuchlinski, Jr.
Assistant Examiner—Diego F. F. Gutierrez
Attorney, Agent, or Firm—Arthur L. Plevy

[57] ABSTRACT

A thermocouple probe for use in an autoclave has two conductive wires spaced apart and supported in parallel relation by fluoropolymer insulation material. The structure is air-tight which eliminates vacuum and/or steam leakage along the wire and is relatively flat so as not to disrupt the seal where the thermocouple passes through the autoclave. A method is also provided to produce the thermocouple in a single extrusion step that ensures uniformity, proper calibration and reliability of the thermocouple.

14 Claims, 2 Drawing Sheets

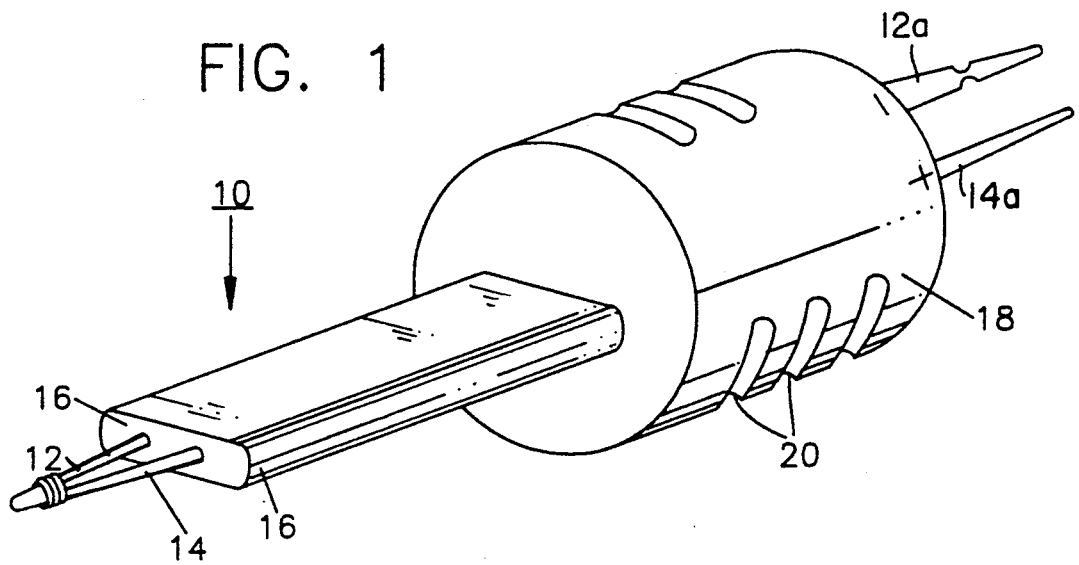
FIG. 1
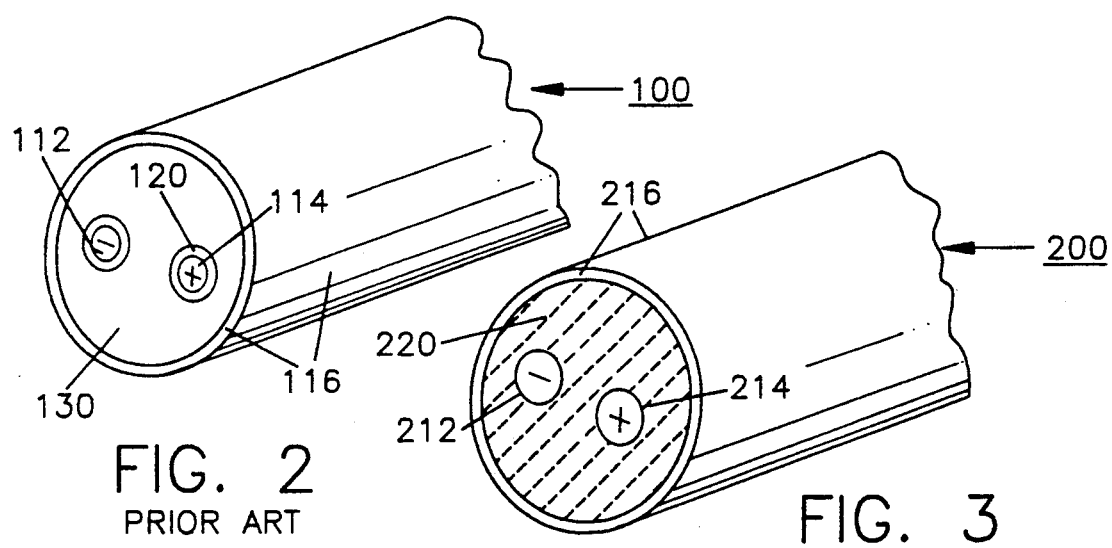
FIG. 2
PRIOR ART
FIG. 3
PRIOR ART
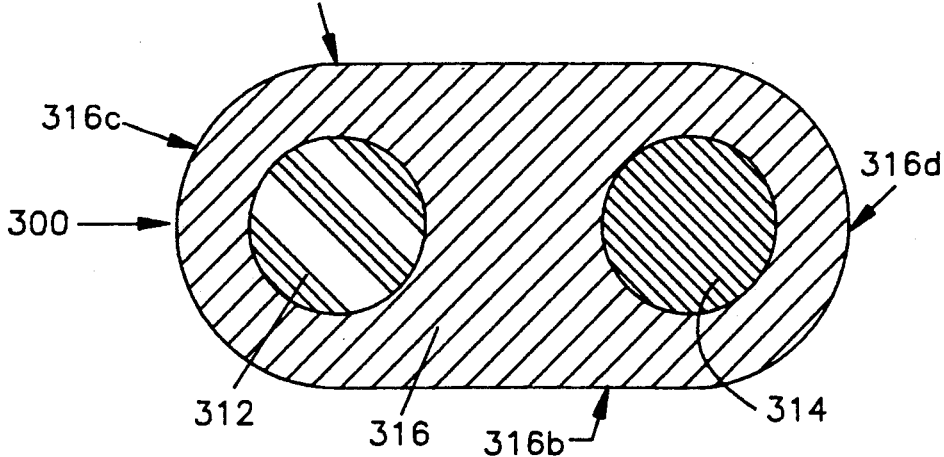
FIG. 4

THERMOCOUPLE FOR AUTOCLAVE AND METHOD OF MAKING THE SAME

FIELD OF THE INVENTION

This invention relates to thermocouples for use in high temperature, high pressure environments, such as in an autoclave. A method of making the thermocouple is also provided herein.

BACKGROUND OF THE INVENTION

It is customary to use a thermocouple to measure temperature in high pressure, high temperature environments as those associated with autoclaves, furnaces, boilers, etc. However, known thermocouples are of the typical duplex wire construction which permits vacuum and/or steam leakage between and along the insulated conductors. These conductors are wrapped with a sleeve of insulation around which a jacket is positioned to contain each insulated wire. Unfortunately, air spaces are formed between each sleeve of insulation and the jacket which permit the aforementioned vacuum and/or steam leakage to occur. The air space reduces the efficiency of the vacuum unit.

Other thermocouples utilize an epoxy to fill any air spaces that may exist between the insulated conductors and the jacket. With this configuration, the epoxy or sealing substance can be drawn into the vacuum within the autoclave during operation.

Additionally, the traditional duplex wire used in the known thermocouples is sized and shaped so that a good seal is jeopardized where the thermocouple passes through the autoclave door.

Moreover, it has been normal practice for the industrial user to purchase wire and produce the thermocouple in-house, afterwhich the thermocouple is reused several times. Unfortunately, if accurate readings of temperature are necessary, the reworked thermocouple must be recalibrated, rechecked for any damage or malfunctioning problems and one end reformed for entry into the autoclave. The procedure of refitting the known thermocouple for reuse requires extra equipment and manhours which translates into reduced cost-effectiveness.

SUMMARY OF THE INVENTION

The problems and disadvantages of the known thermocouples discussed above are overcome in accordance with the present invention by providing an improved wire for use in a thermocouple and method for making the same. The thermocouple probe of the invention herein greatly reduces, if not eliminates, vacuum leakage and steam presence through the thermocouple. The thermocouple wire is formed to substantially eliminate the spaces or air pockets along the length of the wire in which air may accumulate. Additionally, the thermocouple probe herein is of single-extrusion manufacture, already calibrated and of a size and shape more conducive for maintaining the seal around the thermocouple where it passes through the vacuum bags.

Provision is also made for the thermocouple probe of the invention to have a molded connector plug attached at one end of the wire. This connector plug can be produced with the probe and is constructed to eliminate loose connections between the wire and the connector. One end of each conductor of the thermocouple probe is sealed within the plug, thereby eliminating the chance for moisture and/or foreign matter to accumulate, as it sometimes does when using the standard screw terminals. The susceptibility to vibration and shorts is also eliminated.

Also shown is an illustration of an extrusion operation and an extruder tip used in the operation to make the thermocouple probe described herein.

The industrial user will appreciate that the design of the thermocouple provides for an economical, single-use application with an autoclave, although the user is certainly not limited to one application with the thermocouple probe. The thermocouple wire is fabricated so that the industrial user can eliminate the in-house production of the thermocouple, and obtain a reliable, ready-to-use and cost effective thermocouple, that is more accurate than the version produced in-house.

BRIEF DESCRIPTION OF THE FIGURES

For a more complete understanding of the present invention, reference may be had to the following description of an exemplary embodiment considered in connection with the accompanying drawings, in which:

FIG. 1 is a perspective view partly in section showing a preferred embodiment of the thermocouple probe and the connector plug of the present invention;

FIG. 2 is a perspective view partly in section showing one example of the prior art;

FIG. 3 is a perspective view partly in section showing another example of the prior art.

FIG. 4 is a cross-sectional view of the preferred embodiment of the thermocouple probe of the present invention and that which is shown in FIG. 1.

DETAILED DESCRIPTION OF THE FIGURES

Figure 5:
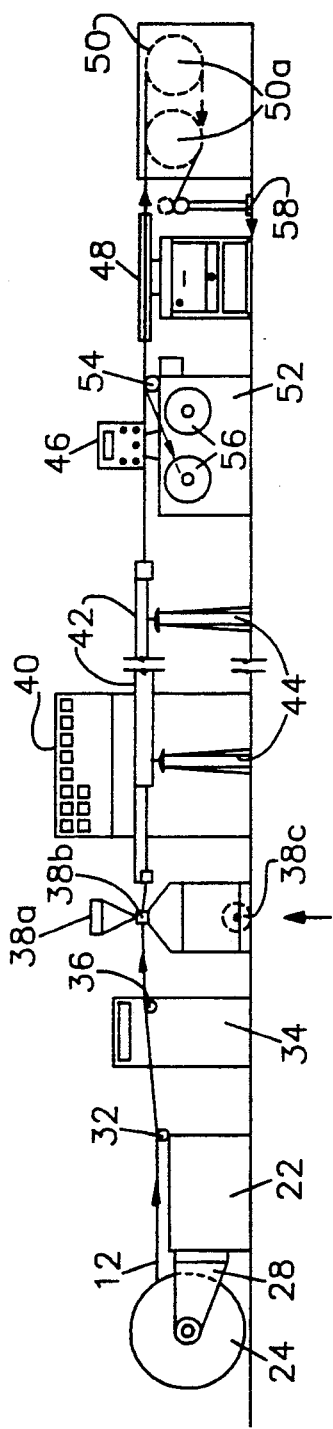
FIG. 5 is a view of an extrusion operation to make the thermocouple as shown in FIGS. 1 and 4.

Referring now to FIGS. 1 and 4, there is shown a thermocouple 10, 300 for an autoclave (not shown), including wire conductors 12, 14 and 312, 314 positioned parallel to each other and completely surrounded by insulation 16, 316. The conductors 12, 14 and 312, 314 project from and are therefore exposed (FIG. 1) at one end of the thermocouple 10 for being twisted and provided with a weld.

As shown in FIG. 1, the conductors 12, 4 are, in addition to being parallel within the insulation 16, evenly spaced from the surrounding sides of the insulation 16. The form of the insulation 16 is sized and shaped to be noncircular and somewhat flattened, so as not to disturb the seal of the autoclave where the thermocouple 10 passes therethrough. At an opposite end of the thermocouple 10, there is attached a connector plug 18 (i.e., standard size male plug with iron-constantan pins fully enclosed, or potted) which may be formed at its surface with grooves or lines of scoring 20 to facilitate gripping of the plug 18. Projecting from the plug 18 are pins 12a, 14a, each of which are connected to a corresponding one of the conductors 12, 14 at terminals (not shown) within the plug 18. The connection at the terminals within the plug is accomplished by crimping each of the conductors 12, 14 to a corresponding terminal. The method of crimping is preferable because crimping does not result in the air pockets in which moisture and/or foreign matter may gather as occurs with screw terminals. The pins 12a, 14a of the plug 18 are inserted into a board or panel (no shown) for measuring the temperature of the autoclave.

The conductors 12, 14 are made of good conducting materials, such as iron and constantan (found in insulated type J wire, for example) and are arranged in a spaced, parallel relationship with each other while being embedded in a mass of insulation 16. No air pockets or spaces are present in the insulation 16. The wire can be of any size, although 20 gauge and 28 gauge appear to be the most versatile for use with autoclaves. The junction of the conductors 12, 14 occurs externally at one end of the thermocouple 10 where the conductors 12, 14 are twisted about each other and then TIG welded, for superior reliability.

The insulation 16 is a fluoropolymer or a fluorocarbon, such as that produced under the trademark of TEFLON, TEFLON PFA or TEFLON FEP, for example. The insulation 16 is extruded to surround the conductors 12, 14 and is able to withstand temperatures up to 400° F. There is no jacket to surround and contain the insulation 16.

FIGS. 2 and 3 show known thermocouple wires. Contrary to the present invention, the wire 100 shown in FIG. 2 permits a substantial air space 130 to exist between the insulation 120 of each conductor 112, 114 and the jacket 116 that surrounds the conductors 112, 114. This sort of cable 100 permits vacuum and steam leakage through the thermocouple resulting in inaccurate and unreliable measurements of the autoclave interior. The cable 200 in FIG. 3 has the space in and around the wires 212, 214 filled with insulation 220, the insulation being sealed with a jacket 216. Unfortunately, the insulation 220 could deteriorate or be drawn into the autoclave during operation of the same. This may foul the interior of the autoclave.

FIG. 4 shows a preferred shape of the thermocouple insulation 216 after it has cured completely surrounding the conductors 312, 314. Each conductor 312, 314, is positioned within the insulation 316 so that each is surrounded by an equal amount of insulation 316. The insulation 316 is formed with a flattened top side 316a and a flattened bottom side 316b which are joined with arcuate sides 316c, 316d. The non-circular or flattened profile of the thermocouple probe is specifically designed to reduce, if not eliminate, breaching of the seal where the thermocouple probe passes through and into the autoclave.

As shown in FIG. 5, the thermocouple probe of the present invention may be assembled in an extrusion operation as follows.

A payoff 22 holds two spools 24, 26 (only one of which can be seen) of wire 12, 14, (only one of which can be seen) at ambient temperature. Brackets 28, 30 (only one of which can be seen) attached to the payoff 22 may be used to support the spools 24, 26 at the payoff 22. The wires 12, 14 pass over a roller 32 from the payoff 22.

The conductors 12, 14 pass through a preheater 34. The preheater 34 heats each of the conductors 12, 14 separately so that the conductors 12, 14 are warmed for the extrusion step to be described hereinafter. Each conductor 12, 14 is heated to approximately 150 to 200 degrees Fahrenheit. The preheating promotes the adhesion of the insulation 16 to the conductors 12, 14, eliminates any moisture or drawing-die lubricant on the conductors and also ensures that the insulation 16 will cool in a uniform manner when contacting the conductors 12, 14. The preheater 34 has a roller 36 over which the conductors 12, 14 are led. Preheating may be accomplished by gas burner or an electrical resistance heater, for example.

Figure 6:
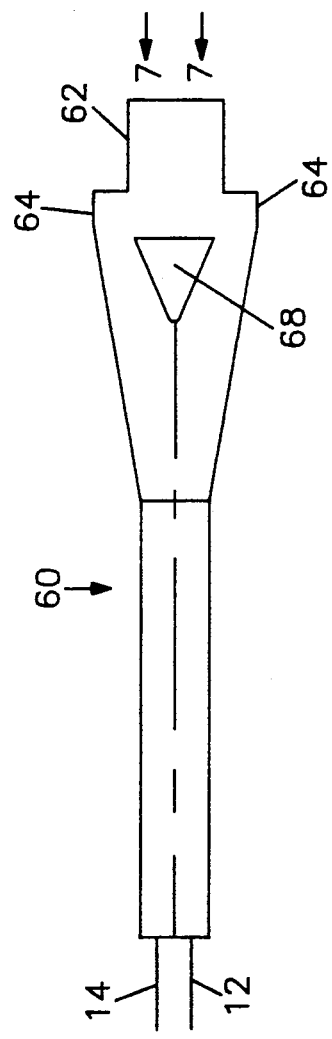
FIG. 6 is a side plan view of a die used in the extrusion operation shown in FIG. 5.
Figure 7:
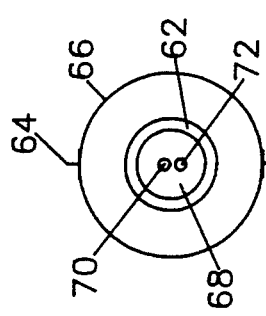
FIG. 7 is a rear view along line 7—7 in FIG. 6 of the die used in the extrusion operation.

The conductors 12, 14 then enter the extruder 38. The extruder 38 consists of a hopper 38a into which the insulation is fed, and a die with an extruder tip 60 (FIGS. 6 and 7). A pump 38c may also be provided to displace the air in the extruder or to provide a vacuum in the same. A speed indicator may also be provided to show the rate at which the conductors 12, 14 are being extruded. A motor to move the plastic material into the extruder can also be used. A heat panel 40 controls the extruder operation. The insulation usually enters the extruder 38 as granules which are heated to a temperature of approximately 725–800 degrees Fahrenheit. The conductors 12, 14 are separated to a predetermined distance by the extruder tip 60 and then move through the melted plastic in a parallel relationship. The distance will vary according to the gauge of the conductors 12, 14. The melted plastic now forms the insulation 16 and completely surrounds the conductors 12, 14. The separation of the conductors 12, 14 and shape of the insulation 16 is discussed hereinafter regarding FIG. 6.

The heated insulation 16 containing the conductors 12, 14 exits the extruder 38 to be cooled in the cooling trough 42. Adjustable stands 44 hold the cooling trough 42 at the level required. It is necessary to cool the wire so that it will resist deformation and sticking during the windup operation. Gradient cooling in water at a temperature of from approximately 104 to 176 degrees Fahrenheit is preferable to rapid cooling which may degrade the insulation structure. Using gradient cooling, the water temperature in the trough 42 is higher near the extruder 38. This type of cooling prevents "shell" hardening which results when the outer surface of the insulation cools and hardens more quickly, thereby causing the inner insulation material to subsequently cool and adhere to the outer surface while pulling away from the conductors 12, 14.

The wire then passes by a dimensional control unit 46. The dimensional control 46 senses the insulation wire size to determine if the insulation 16 is being formed with the chosen outside diameter ("O.D.") so that a uniform O.D. is maintained and variations in the O.D. are avoided. The O.D. of the wire is adjusted by the control 46 sensing the diameter of the insulation and directing the take-up, discussed hereinafter, to either slow or speed the wire through the extruder 38 and cooling trough 42.

The wire is then passed by a cable fault detector or sparker 48 that detects faults in the insulation wall. The frequency of faults often indicates that the extruder 38 is malfunctioning in some manner.

The wire is then led to the capstan 50 which supplies the power to pull the conductors 12, 14 to and through the extrusion operation. The capstan 50 may be of the wheel-type (shown) or the tractor or caterpillar-type (not shown). Friction between the insulation 16 and the drive drums 50a maintains wire speed and eliminates vibration along the wire.

The wire is finally collected at the take-up 52. A roller 54 at the take-up 52 directs the wire to the drums 56 where the finished wire is collected.

An accumulator 58 may be used to collect and contain the wire when the drums 56 of the take-up 52 are wound full and in need of being replaced.

FIG. 6 shows the extruder tip 60 to be used with the extruder 38. The extruder tip 60 has a threaded collar 62 that is screwed into a bore or bushing (not shown) provided in the extruder 38. The tip 60 is formed with wrench flats 64 to facilitate the mounting of the tip 60 to the extruder 38.

FIG. 7 shows the extruder tip 60 having an outside wall 66 with the wrench flats 64. The tip 60 has a hollow portion 68. Two passages 70, 72 extend from the hollow portion 68 entirely through the remainder of the tip 60 so that the conductor 14 may pass through passage 70 and the conductor 12 may pass through passage 72. In effect, the passages 70, 72 act as a separator and provide the conductors 12, 14 with the predetermined parallel separation. Upon exiting the extruder tip 60, the conductors 12, 14 are coated with the heated insulation 16.

Using J-wire as an example, the wire is assembled into a thermocouple for use in autoclaves is as follows.

The single extrusion wire is cut to a predetermined length after which both ends of the insulation 16 are stripped. A "hot" end to be inserted into the autoclave is stripped of insulation 16 to expose approximately 1/4 inch of each conductor 12, 14. The "cold" end is stripped of insulation 16 to expose approximately 1 inch of each conductor 12, 14 to be attached to the connector plug. The conductors 12, 14 at the hot end are twisted around each other with 1–3 turns and then TIG (tungsten inert gas) welded. At the cold end, the iron conductor is impressed with an iron pin and the constantan conductor is impressed with a constantan pin. The pins 12a, 14a are inserted into an injection molder having a mold in the shape of the plug 18, for example. The assembled thermocouple is now ready for use in an autoclave.

The thermocouple probe of the present invention is a prefabricated, single extrusion wire of unitized construction. As disclosed in FIGS. 5–7, the conductors 12, 14 are fed simultaneously through the extruder tip 60 under a specified strain that is continuously maintained. The extruder tip 60 acts as a separator to ensure that the conductors 12, 14 are parallel and sufficiently spaced to inhibit shorting. At a position where the conductors 12, 14 leave the extruder tip 60, a heated fluorocarbon for use as the insulation 16 is extruded around the conductors 12, 14 so that the same are embedded in the insulation 16 in an airtight manner. In an assembly line fashion, at designated positions along the extruded thermocouple probe 10, the connector plug 18 can be attached to the probe 10 while the opposite end of the probe 10 has the conductors 12, 14 twisted and TIG welded.

The insulation 16 can be of a clear, colorless fluoropolymer or fluorocarbon so that any faults or potential defects can be immediately identified. The insulation 16 can be color coded, thereby denoting, for example, the polarity of the conductors 12, 14.

The advantages of this thermocouple will be readily appreciated by the industrial user, and particularly, by composite molders and pharmaceutical manufacturers. Many of the costs associated with in-house manufacture are overcome and rendered unnecessary by the invention and method herein. For example, the materials normally needed by the user to fabricate the thermocouple are not required to be in stock. Recovery/Reworking of the used probes to assemble a new thermocouple is also unnecessary. The thermocouple comes preassembled to be used in the bagging area of the autoclave. Cost-effectiveness associated with using the thermocouple is increased due to the reduction in the loss of cage area equipment and maintenance (i.e., welder, tester, tools, etc.), "lease" value of cage area space and employee benefits, including vacation and sick time. The inventory of multiple parts, the administrative cost of ordering materials (wire, connectors, etc.) and the administrative cost of planning inventory are also substantially reduced as are the hidden costs of in-house manufacture of thermocouples, such as autoclave downtime and known/unknown product quality problems associated with poorly worked or reworked thermocouples.

The unique construction of the thermocouple probe virtually eliminates vacuum leakage through the insulation. Each thermocouple, such as that disclosed above, is individually tested to insure circuit integrity and correct polarity, resulting in virtually zero defective thermocouples out in the field. The fluoropolymer insulation is heat-resistant for temperatures up to 400° F. The thermocouple probe is calibrated at 250° and 350° F. (or at other temperatures) to special limits of accuracy (i.e., Thermo Electric Type JJ wire). Other calibrations are also available as the user requires. The thermocouple probe is calibrated in accordance with the National Institute of Standards and Technology (formerly NBS). The probe meets the quality standards of MIL-STD-105, Sampling Procedure for Inspection; MIL-I-45208A, Inspection System Requirements; and ASTM 230, ANSI-MC 96.1 Thermocouple Specifications, (1982). The smaller diameter of the thermocouple wire provides for better sealing at the bag line. Wire terminations are sealed in the connector plug so that no loose connections result. Also, the wire is less susceptible to vibration, moisture, accumulation of foreign matter, shorts, etc. The junction of each conductor at the hot end is TIG welded, not just twisted, for superior reliability. The invention allows for more efficient use of personnel in layup, and autoclave loading and unloading. No silicone, which could foul the autoclave, is used to produce the thermocouple probe. The wire may be FIG. 8 wound in standard 30' lengths or in other lengths as required by the user.

An example of the autoclave thermocouple of the present invention is a unique, inexpensive, ready-to-use thermocouple, consisting of a pre-cut 30 foot length of high temperature 28 gauge insulated type J (Iron-Constantan) thermocouple wire, calibrated to special limits of accuracy. One end of the autoclave thermocouple is a fabricated TIG welded junction; the opposite end is terminated with a standard size male plug with Iron Constantan pins fully enclosed (potted) in a molded plastic connector. The insulation used on the thermocouple is a special blend of high temperature (400° F.) fluoropolymer materials. Because of its unique construction, the thermocouple eliminates a common autoclave problem: vacuum leakage through the thermocouple wire. It also provides for simpler sealing at the bag line due to its smaller overall diameter and non-circular profile.

Because of its low cost and ease of use, the thermocouple is a cost-effective alternative to the in-house manufacture and reworking of known thermocouple wire. If the true cost of in-house manufacture and reworking were to be calculated--including the intangible cost of poorly constructed/reworked thermocouples (which can result in downtime and/or slower autoclave throughput, undetected poor quality, excessive scrap, etc.)--the autoclave thermocouple's cost-effectiveness as a single-use thermocouple becomes clear.

It will be understood that the embodiment described herein is merely exemplary and that a person skilled in the art may make many variations and modifications without departing from the spirit and scope of the invention. All such modifications and variations are intended to be included within the scope of the invention as defined in the appended claims.

I claim:

1. In combination with an autoclave having an internal gas pressure differing from the surrounding ambient pressure, an improved thermocouple probe passing through said autoclave for the measurement of temperature therein, said improved thermocouple probe consisting of:

a first and second thermoelectrically conductive wires being joined at one end through a connecting means, said first wire and said second wire being formed of thermoelectrically dissimilar materials; and a single homogenous insulating means, having substantially no air pockets formed therein, enveloping and electrically insulating a length of said first and second wires proximate said connecting means, said insulating means itself being, and creating a seal with said first and second wires being impervious to gas at pressure equivalent to the differential between said internal gas pressure of said vessel and said ambient pressure, said insulating means having a predetermined shape causing a minimal loss of structural integrity to said autoclave as said insulating means is passed into said autoclave.

2. The thermocouple probe of claim 1, wherein said insulating means is a sheath surrounding a length of said first and said second wire, said sheath formed from a solid fluoropolymer.

3. The thermocouple probe of claim 2, wherein said connecting means includes a tungsten inert gas (TIG) weld.

4. The thermocouple probe of claim 3, wherein said connecting means includes twisting said first wire and said second wire together.

5. The thermocouple probe of claim 2, wherein said fluoropolymer is TEFLON, TEFLON PFA or TEFLON FEP.

6. The thermocouple probe of claim 2, wherein said sheath holds said first and second wires in a substantially parallel orientation.

7. The thermocouple probe of claim 6, wherein said predetermined shape is substantially elliptical having a flat top surface and a flat bottom surface connected by opposing arcuate sides.

8. The thermocouple probe of claim 7, wherein each of said opposing arcuate sides is coaxially positioned around one of said first or second wires.

9. The thermocouple probe of claim 8, wherein said flat top surface and said flat bottom surface are tangential to said opposing arcuate sides.

10. The thermocouple probe of claim 2, wherein said first and second wires terminate in a connector plug opposite said connecting means.

11. The thermocouple probe of claim 2, wherein said sheath is substantially clear.

12. The thermocouple probe of claim 2, wherein said sheath is heat-resistant to at least 400° F.

13. A thermocouple probe according to claim 1, including an indicia means thereon denoting the polarity of said first and second wires.

14. A method for fabricating a thermocouple probe to be used in an autoclave, said probe consisting of first and second wires surrounded by a single homogenous sheath of insulation that is impermeable to pressurized gas, and having substantially no air pockets; the method comprising the steps of separating said first and second wires into a parallel relationship at a predetermined distance and extruding said insulation about said first and second wires such that said first and second wires are complete embedded within said insulation, and a gas impervious seal is created between said first and second wires and said insulation and such that said thermocouple wire has a profile with a non-circular shape with a flat top and bottom side connected by opposing arcuate sides.

* * * * *